US010354981B2

(12) United States Patent
Lai et al.

(10) Patent No.: US 10,354,981 B2
(45) Date of Patent: Jul. 16, 2019

(54) DISPLAY AND REPAIR METHOD THEREOF

(71) Applicant: PlayNitride Inc., Tainan (TW)

(72) Inventors: Yu-Hung Lai, Tainan (TW); Yun-Li Li, Tainan (TW); Tzu-Yang Lin, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 15/828,357

(22) Filed: Nov. 30, 2017

(65) Prior Publication Data
US 2018/0159088 A1   Jun. 7, 2018

(30) Foreign Application Priority Data

Dec. 2, 2016   (TW) .............................. 105140020 A

(51) Int. Cl.
H01L 25/075 (2006.01)
H01L 51/56 (2006.01)
H01L 21/52 (2006.01)
H01L 21/66 (2006.01)
H01L 23/00 (2006.01)
H01L 27/15 (2006.01)
H01L 33/00 (2010.01)

(52) U.S. Cl.
CPC .......... H01L 25/0753 (2013.01); H01L 21/52 (2013.01); H01L 22/22 (2013.01); H01L 22/32 (2013.01); H01L 24/05 (2013.01); H01L 51/56 (2013.01); G09G 2330/08 (2013.01); H01L 27/156 (2013.01); H01L 33/0095 (2013.01); H01L 2251/568 (2013.01)

(58) Field of Classification Search
None
See application file for complete search history.

(56) References Cited

U.S. PATENT DOCUMENTS

| 9,000,459 | B2 * | 4/2015 | Brown | H01L 27/3223 |
| | | | | 257/89 |
| 9,583,037 | B2 * | 2/2017 | Omoto | G09G 3/30 |
| 2014/0267683 | A1 * | 9/2014 | Bibl | H01L 51/50 |
| | | | | 348/87 |
| 2015/0187249 | A1 * | 7/2015 | Tani | G09G 3/006 |
| | | | | 345/694 |
| 2016/0351092 | A1 * | 12/2016 | Chen | G09G 3/3233 |
| 2017/0213496 | A1 * | 7/2017 | Hsu | G09G 3/2074 |

(Continued)

FOREIGN PATENT DOCUMENTS

| CN | 103839961 | 6/2014 |
| TW | 200901155 | 1/2009 |

(Continued)

Primary Examiner — Andres Munoz
(74) Attorney, Agent, or Firm — JCIPRNET

(57) ABSTRACT

A display including a back plate, a plurality of light emitting devices and a plurality of compensating light emitting devices is provided. The back plate has a plurality of pixels and at least one compensated region. The compensated region includes some of the pixels. The light emitting devices are arranged in all the pixels on the back plate. The compensated light emitting devices are disposed on the back plate and located in each pixel in the compensated region respectively. At least one of the pixels in the compensated region is dead pixel. Besides, a repair method of the display is also provided.

8 Claims, 5 Drawing Sheets

(56) References Cited

U.S. PATENT DOCUMENTS

2018/0198020 A1* 7/2018 Lai .................. H01L 33/06
2018/0261647 A1* 9/2018 Lai .................. H01L 27/156
2018/0294387 A1* 10/2018 Li .................... H01L 33/486

FOREIGN PATENT DOCUMENTS

TW      201009805      3/2010
TW      201525959      7/2015

\* cited by examiner

DISPLAY AND REPAIR METHOD THEREOF

CROSS-REFERENCE TO RELATED APPLICATION

This application claims the priority benefit of Taiwan application serial no. 105140020, filed on Dec. 2, 2016. The entirety of the above-mentioned patent application is hereby incorporated by reference herein and made a part of this specification.

BACKGROUND OF THE INVENTION

1. Field of the Invention

The invention relates to a display and a repair method of the display, and particularly relates to a light emitting diode display and a repair method of the light emitting diode display.

2. Description of Related Art

As the photoelectric technologies advance, the size of various photoelectric devices has become miniaturized. Owing to the breakthrough in size of light emitting diodes (LEDs) in recent years, the micro light emitting diode (micro LED) displays with micro LED array have drawn the attention on the market. The micro LED displays are a type of displays of active light emitting devices. In addition to lower power consumption compared to the organic light emitting diode (OLED) displays, the LED displays also has better contrast performance and higher viewability in the sunlight. Besides, since the micro LED displays are made of an inorganic material, the LED displays exhibit a higher reliability and longer lifetime compared to the OLED displays.

Currently, the yield of the LEDs is not yet perfect. After the LEDs are disposed on a back plate and electrically connected with a circuit, some of the LEDs may be unable to work or bad light emitting performance, those LEDs are forming dead spots of the display. Generally speaking, the LEDs of the display are connected to the circuit on the back plate, a repair process is performed to remove each of the LED chips of the dead spots and to dispose a new LED chip one by one. However, there may be thousands or even millions of micro LED chips disposed in a conventional micro LED display, the repair process will take a long time.

SUMMARY OF THE INVENTION

The invention provides a display. The display is repaired with a repair method having a high efficiency to have a preferable display quality.

The invention provides a repair method of a display capable of repairing the display at a high efficiency to make the display have a preferable display quality.

A display according to an embodiment of the invention includes a back plate, a plurality of light emitting devices, and a plurality of compensating light emitting devices. The back plate has a plurality of pixels and at least one compensated region and each of the pixels comprises a plurality of sub-pixels, each of the sub-pixels comprises a predetermined light emitting region and a reserved compensated region. The compensated region includes at least a part of the pixels. The light emitting devices are in the respective pixels on the back plate and disposed in the predetermined light emitting regions. The compensating light emitting devices are disposed on the back plate and located in each pixel in the compensated region. At least one of the pixels located in the compensated region is a dead pixel and the reserved compensated region is configured to dispose one of the compensating light emitting devices.

According to an embodiment of the invention, each of the sub-pixels includes one of the light emitting devices. One of the sub-pixels of the dead pixel is a dead sub-pixel. The dead sub-pixel has a predetermined emission color. The compensating light emitting devices have the predetermined emission color and are disposed in the sub-pixels having the predetermined emission color in the compensated region.

According to an embodiment of the invention, one of the sub-pixels of the dead pixel is a dead sub-pixel and the dead sub-pixel has a predetermined emission color. The compensating light emitting devices are disposed in the sub-pixels having the predetermined emission color in the compensated region and disposed in the reserved compensated regions. Each of the reserved compensated regions includes a bonding layer, and each of the compensating light emitting devices is bonded to one of the reserved compensated regions through one of the bonding layers.

According to an embodiment of the invention, the light emitting device of the predetermined light emitting region of the dead sub-pixel has a poor light emitting performance, or loses during the manufacturing process.

According to an embodiment of the invention, the light emitting device having the poor light emitting performance is not electrically connected with the back plate, or is contaminated.

According to an embodiment of the invention, the compensated region includes a plurality of dead pixels.

According to an embodiment of the invention, the back plate includes a plurality of compensated regions.

According to an embodiment of the invention, a diagonal length of each of the light emitting devices and the compensating light emitting devices is in a range from 2 micrometers to 150 micrometers.

A repair method of a display according to an embodiment of the invention includes: detecting the display to position at least one dead pixel and a compensated region including the dead pixel in a plurality of pixels on a back plate; providing a plurality of compensating light emitting devices; and disposing the compensating light emitting devices on the back plate, such that each pixel in the compensated region on the back plate has at least one of the compensating light emitting devices. The step of disposing the compensating light emitting devices on the back plate includes: providing a transfer substrate, wherein the compensating light emitting devices are disposed on the transfer substrate; and docking the transfer substrate and the back plate, such that the compensating light emitting devices are transferred to corresponding pixels of the pixels on the back plate According to an embodiment of the invention, each of the pixels includes a plurality of sub-pixels, the dead pixel has at least one dead sub-pixel, and the dead sub-pixel has a predetermined emission color. At the step of providing the compensating light emitting devices, the compensating light emitting devices have the predetermined emission color.

According to an embodiment of the invention, each of the sub-pixels includes a predetermined light emitting region and a reserved compensated region, and the step of disposing the compensating light emitting devices on the back plate further includes disposing a plurality of bonding layers in the reserved compensated regions respectively. The compensating light emitting devices are bonded to the corresponding reserved compensated regions through the bonding layers.

According to an embodiment of the invention, the light emitting device of the predetermined light emitting region of the dead sub-pixel has a poor light emitting performance, or loses during the manufacturing process.

According to an embodiment of the invention, the light emitting device having the poor light emitting performance is not electrically connected with the back plate, or is contaminated.

According to an embodiment of the invention, the step of detecting the display includes positioning a plurality of the dead pixels in the compensated region.

According to an embodiment of the invention, a diagonal length of each of the compensating light emitting devices is in a range from 2 micrometers to 150 micrometers.

Based on the above, the repair method of the display according to the embodiments of the invention includes detecting the display to position at least one dead pixel and the compensated region including the dead pixel on the back plate, and disposing the compensating light emitting devices on the back plate. Each pixel in the compensated region on the back plate has the compensating light emitting device. Accordingly, the compensating light emitting device at the dead pixel may substitute for the original light emitting device. Generally speaking, the light emitting device in the dead pixel and the light emitting devices in the pixels near the dead pixel undergo the same epitaxial or transfer process, therefore, the pixels nearby the dead pixel are more likely to be dead pixels. In the display repaired based on the repair method of the invention, each pixel adjacent to the dead pixel includes at least one of the compensating light emitting devices, the dead pixels in the compensated region may be repaired at the same time. Namely, the repair method of the display repairs the display at a high efficiency.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
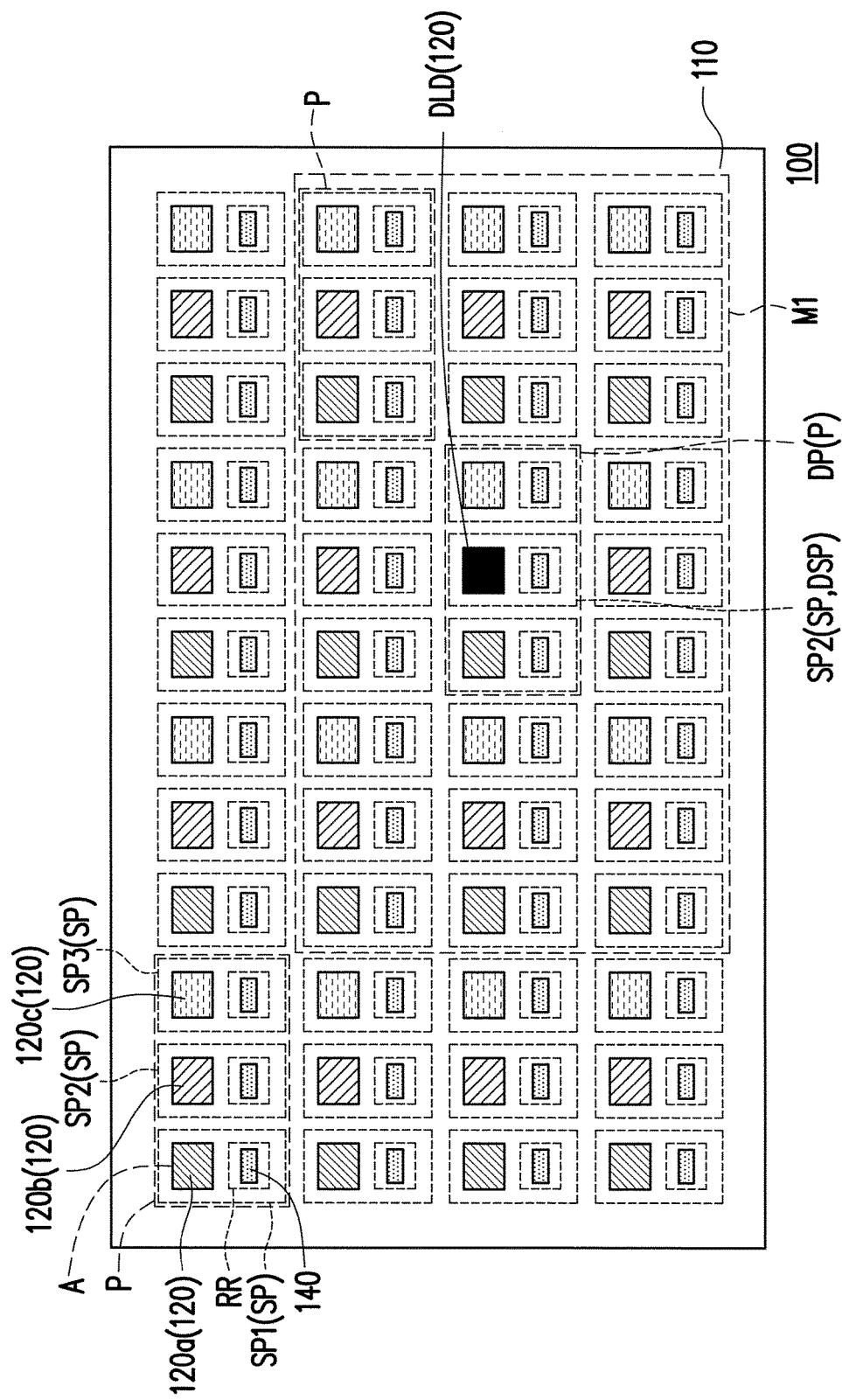
FIGS. 1A and 1B are views illustrating a repair method of a display according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
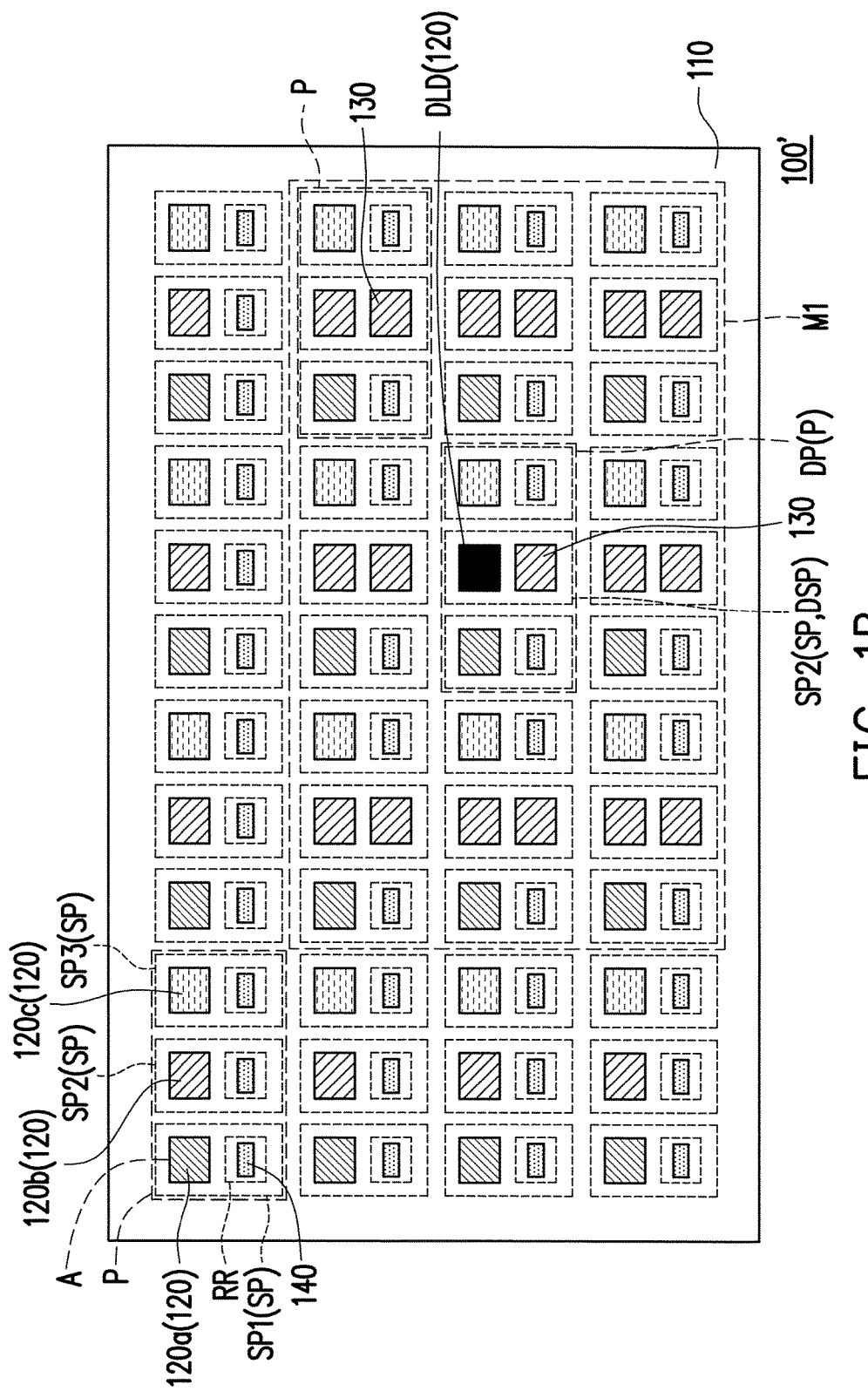

FIGS. 1A and 1B are views illustrating a repair method of a display according to an embodiment of the invention. Referring to FIG. 1A, in the embodiment, a display 100 includes a back plate 110 and a plurality of light emitting devices 120. The light emitting devices 120 are arranged and disposed on the back plate 110. The back plate 110 has a plurality of pixels P, and the light emitting devices 120 are correspondingly disposed in the respective pixels P. The display 100 emits light through the light emitting devices 120 in the pixels P to display a color display image. In addition, the light emitting devices 120 may also project a color image. Specifically, the light emitting devices 120 are arranged into an array on the back plate 110 to form the pixels P of the display 100. In the embodiment, each of the pixels P of the display 100 includes a plurality of sub-pixels SP, and each of the sub-pixels SP includes a predetermined light emitting region A and a reserved compensated region RR. The light emitting devices 120 are respectively disposed in the respective light emitting regions A. Specifically, each of the pixels P includes three sub-pixels SP, namely a first sub-pixel SP1, a second sub-pixel SP2, and a third sub-pixel SP3. The first sub-pixel SP1 includes a first light emitting device 120a, the second sub-pixel SP2 includes a second light emitting device 120b, and the third sub-pixel SP3 includes a third light emitting device 120c.

In the embodiment, the first light emitting device 120a of the first sub-pixel SP1 has a first emission color, the second light emitting device 120b of the second sub-pixel SP2 has a second emission color, and the third light emitting device 120c of the third sub-pixel SP3 has a third emission color. In addition, the first emission color, the second emission color, and the third emission color are different from each other. Specifically, the first light emitting device 120a having the first emission color, the second light emitting device 120b having the second emission color, and the third light emitting device 120c having the third emission color may be arranged in a suitable order based on display design. In the embodiment, the first emission color is red, the second emission color is green, and the third emission color is blue. However, in other embodiments, the sub-pixels SP of each of the pixels P may be in other arrangements of colors. The invention does not intend to impose a limitation in this regard. In addition, in some embodiments, the light emitting devices 120 in the respective sub-pixels SP may include other colors, such as yellow. Alternatively, the light emitting device 120 may emit light in a single color, or the light emitting device 120 may emit light in different colors. Besides, each of the pixels P may also include a different number of the sub-pixels SP and a different number of light emitting devices 120 to render a colorful display, a single-color display, or other display performance. The invention does not intend to impose a limitation in this regard.

In the embodiment, the light emitting devices 120 (the first light emitting device 120a, the second light emitting device 120b, and the third light emitting device 120c) are light emitting diodes (LEDs). More specifically, the light emitting devices 120 are micro-LEDs miniaturized in size. In relevant embodiments, the light emitting devices 120 with different emission colors may bring forth a full-color display or projection effect through suitable arrangement and choices on emission colors. The invention does not intend to impose a limitation on the choices on colors and the arrangements of the light emitting devices 120. The choice on colors of the light emitting devices 120 and the arrangement of the light emitting devices 120 on the back plate 110 may be adjusted based on different uses, design specifications, and strategies for product.

In the embodiment, a surface of the back plate 110 includes a circuit structure (not shown), and the light emitting devices 120 are electrically connected to the circuit structure through a plurality of contact pads of the circuit structure. Therefore, the light emitting devices 120 arranged in an array on the back plate 110 are driven by the circuit structure. In other words, the back plate 110 having different circuit structures may be a semiconductor substrate, a submount, a complementary metal-oxide-semiconductor (CMOS) substrate, a liquid crystal on silicon (LCOS) substrate, a thin film transistor (TFT) substrate, or substrates of other types. The type of the back plate 110 and the corresponding circuit structure of the back plate 110 may be adjusted subject to different needs of use, design specifications, and strategies for product placement. The invention does not intend to impose a limitation in this regard.

Referring to FIG. 1A, first, the display 100 is detected to position a dead sub-pixel DSP unable to emit light. For example, the predetermined light emitting region A of the second sub-pixel SP2 in the embodiment is unable to emit light normally. The light emitting device 120 in the second sub-pixel SP2 is a dead light emitting device DLD of the display 100. Therefore, the second sub-pixel SP2 where the light emitting device 120 having a poor light emitting performance is located is the dead sub-pixel DSP, and the pixel P where the dead sub-pixel DSP is located is the dead pixel DP. In relevant embodiments, a circumstance for determining that the predetermined light emitting region A is unable to emit light normally may be defined based on practical needs. For example, in some embodiments, when the light emitting device 120 is damaged and unable to emit light, the light emitting device 120 is defined as the dead light emitting device DLD having a poor light emitting performance. Alternatively, in some other embodiments, when the light emitting device 120 fails to control emitting brightness, the light emitting device 120 is defined as the dead light emitting device DLD having a poor light emitting performance. In yet some other embodiments, when the light emitting device 120 is not electrically connected with the back plate, or the light emitting device 120 is contaminated, the light emitting device 120 is defined as the dead light emitting device DLD having a poor light emitting performance. In still some other embodiments, the predetermined light emitting region A of one of the sub-pixels SP loses the light emitting device 120. Therefore, the pixel P where the sub-pixel SP without light emitting device 120 is located is defined as the dead pixel DP. It should be noted that the invention does not intend to impose a limitation in this regard.

In the embodiment, after the dead pixel DP is positioned, it is preferable to define a compensated region M1 with the dead pixel DP as the center. The compensated region M1 includes the dead pixel DP and other normal pixels near the dead pixel DP. Specifically, to meet repair requirements of the display 100, a compensated region is larger, i.e., including more pixels, may be defined. The invention does not intend to impose a limitation in this regard.

Then, referring to FIG. 1B, in the embodiment, the repair method of the display further includes providing a plurality of compensating light emitting devices 130. The light emitting devices 130 are correspondingly disposed in the compensated region M1 of the back plate 110. Accordingly, in a compensated display 100', each of the pixels P in the compensated region M1 includes at least one the compensating light emitting devices 130.

Specifically, the second sub-pixel SP2 in the dead pixel DP is the dead sub-pixel DSP, and the light emitting device 120 (i.e., the dead light emitting device DLD) in the dead sub-pixel DSP has a predetermined emission color, such as green. Specifically, the predetermined emission color is an expected emission color of the dead sub-pixel. However, the light emitting device 120 of the dead sub-pixel is unable to emit light normally. Thus, the compensating light emitting device emitting light in the same color is disposed in each green sub-pixel in the compensated region. Besides, the expected emission color of the dead sub-pixel DSP may also be red, blue, or other colors in some embodiments. The provided compensating light emitting devices with different colors are also chosen based on the dead light emitting device DLD of the dead sub-pixel. It should be noted that the invention does not intend to impose a limitation in this regard.

Specifically, referring to FIG. 1B, in the repaired display 100', the dead sub-pixel DSP includes the compensating light emitting device 130, and the sub-pixel SP having the same emission color as that of the dead sub-pixel in the compensated region M1 also include the compensating light emitting device 130.

In some embodiments, when the first sub-pixel SP1 in the dead pixel DP is defined as the dead sub-pixel DSP, the compensating light emitting device 130 is disposed in each first sub-pixel SP1 in the compensated region M1, and the compensating light emitting device and the first sub-pixel SP1 have the same emission color. In some other embodiments, when the third sub-pixel SP3 in the dead pixel DP is defined as the dead sub-pixel DSP, the compensating light emitting device 130 is disposed in each third sub-pixel SP3 in the compensated region M1, and the compensating light emitting devices and the third sub-pixel SP3 have the same emission color.

Specifically, a process of disposing the compensating light emitting devices 130 on the back plate 110 includes providing a transfer substrate (not shown). And the compensating light emitting devices 130 are disposed on the transfer substrate. Then, the transfer substrate is docked to the back plate 110 to transfer the compensating light emitting devices 130 to the back plate 110. Specifically, the process of disposing the compensating light emitting devices 130 on the back plate 110 further includes disposing a bonding layer 140 in each of the reserved compensated region RR. When the transfer substrate (not shown) is docked to the back plate 110, each of the compensating light emitting devices 130 is bonded to the reserved compensated region RR through the bonding layer 140. However, in other embodiments, the compensating light emitting devices 130 may also be disposed on the back plate 110 in a different way. The invention does not intend to impose a limitation in this regard.

In the embodiment, the compensated region M1 is in a form of 3×3 pixel matrix. Namely, the compensated region M1 includes nine compensating light emitting devices 130. However, in other embodiments, the compensated region M1 may also in a different form and have a different number of the compensating light emitting devices 130. However, in practices, the compensating light emitting devices 130 are in a small size, and the compensating light emitting devices 130 need to be transferred to the back plate 110 through docking of the transfer substrate (not shown) to the back plate 110. To facilitate docking of the transfer substrate (not shown) to the back plate 110, the transfer substrate (not shown) may not be designed to be too small. Therefore, there is a certain number of the compensating light emitting devices 130 transferred to the back plate 110 through one docking, so the compensated region M1 may have a predetermined size. For example, the compensated region M1 may have 100×100 pixels, for example. However, it should be noted that the invention does not intend to impose a limitation in this regard.

In the embodiment, the compensating light emitting devices 130 may be the same as or similar to the light emitting devices 120 in terms of types and specifications. Relevant descriptions about the compensating light emitting devices 130 may be referred to the relevant descriptions about the light emitting devices 120. Specifically, the compensating light emitting devices 130 and the light emitting devices 120 may be micro LEDs, for example. And a diagonal length of each of the light emitting devices 120 and the light emitting devices 130 is in a range from 2 micrometers to 150 micrometers, for example. However, the invention is not limited thereto. Besides, in order to drive the compensating light emitting devices 130 on the back plate 110, the circuit structure of the back plate 110 further includes a redundant circuit (not shown). When the compensating light emitting devices 130 are bonded to the back plate 110 through the bonding layers 140, the compensating light emitting devices 130 may be electrically connected to a plurality of contact pads of the redundant circuit through the bonding layers 140. A circuit structure of the back plate 110 may drive the compensating light emitting devices 130 by the redundant circuit. In other embodiment, the light emitting devices 120 and the compensating light emitting devices 130 on the back plate 110 may be controlled by the circuit structure. For example, there are other good pixels P in the compensated region M1 and the light emitting device 120 and the compensating light emitting device 130 are both workable in each good pixels P, the circuit structure may control one of the light emitting device 120 and the compensating light emitting device 130 in the good pixel P to emit light and turn off another one. Or, the light emitting device 120 and the compensating light emitting device 130 in the good pixel P may respectively emit light in a lower brightness, so that the pixels P of the repaired display 100' have uniform brightness. However, the invention is not limited thereto.

In the embodiment, the repair method of the display includes detecting the display 100 to define the dead pixel DP and the compensated region M1 including the dead pixel, and disposing the compensating light emitting devices 130 in each pixels of the compensated region M1 on the back plate 110, so that the pixels P in the compensated region include the compensating light emitting devices 130. Accordingly, the compensating light emitting device 130 at the dead pixel DP substitute for the original light emitting device 120 to emit light, thereby the repaired display 100' has a better display quality after repairing. The light emitting device 120 in the dead pixel DP and the light emitting devices 120 in the pixels P near the dead pixel DP undergo the same epitaxial process. Therefore, the pixels P nearby the dead pixel DP are more likely to be dead pixels, or the light emitting devices of the pixels P near the dead pixel DP have low reliability. Since the nearby pixels P adjacent to the dead pixel DP also include the compensating light emitting devices 130, the dead pixels in a nearby region of the dead pixel DP in the display 100 are also repaired. Namely, the repair method of the display of the embodiment may repair the display 100 at a high efficiency. Therefore, the repaired display 100' has a better display quality and a higher reliability.

Figure 2A:
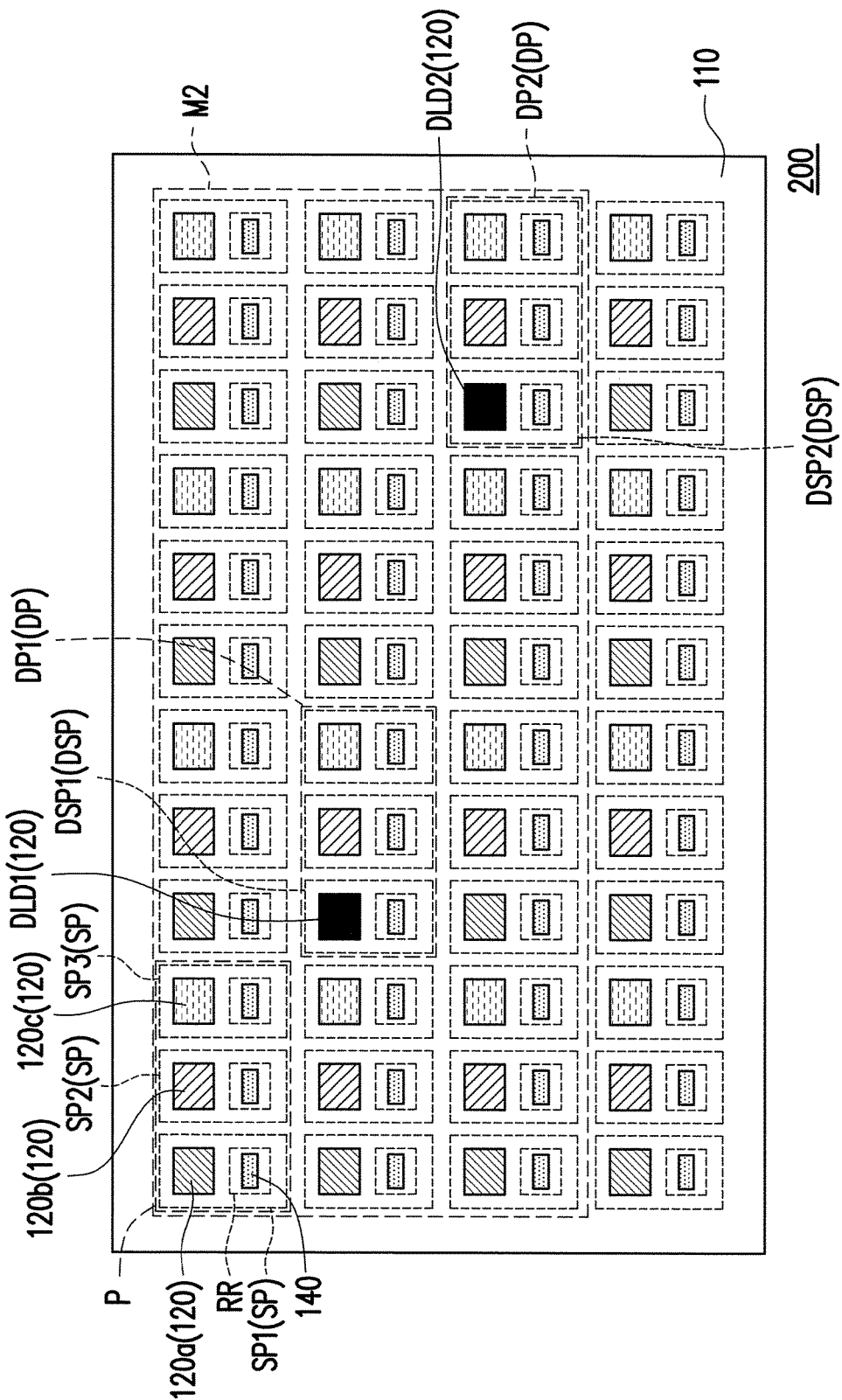
FIGS. 2A and 2B are views illustrating a repair method of a display according to another embodiment of the invention.
Figure 2B:
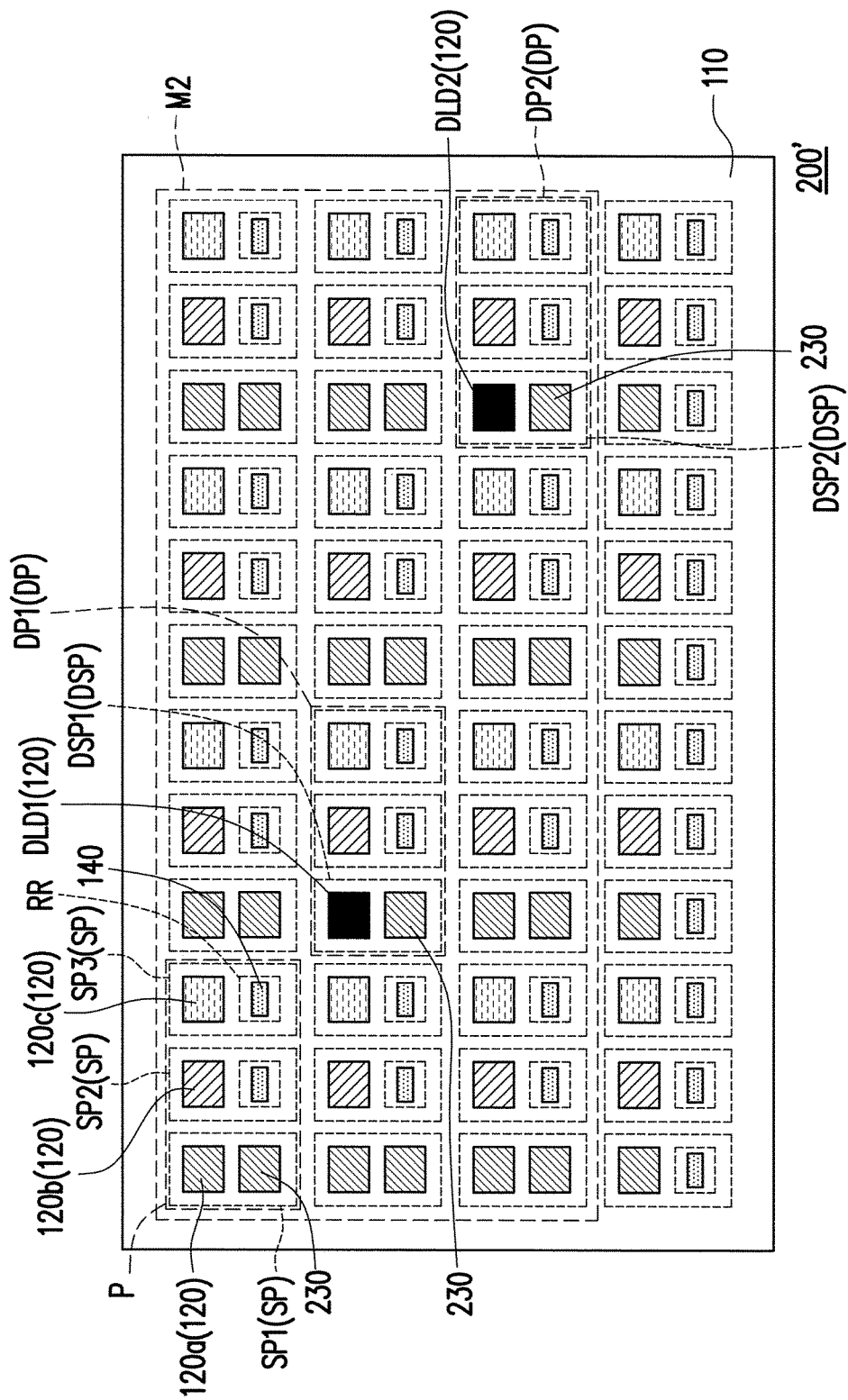

FIGS. 2A and 2B are views illustrating a repair method of a display according to another embodiment of the invention. Referring to FIG. 2A, a display 200 of the embodiment is similar to the display 100 shown in the embodiment of FIGS. 1A and 1B. Components and relevant descriptions of the display 200 may be referred to the components and relevant descriptions of the display 100 in the embodiment of FIGS. 1A and 1B. Thus, details about the back plate 110 and the light emitting devices 120 disposed in the array of the pixels P are not reiterated in the following. The display 200 has a plurality of dead sub-pixels. The difference between the embodiment of the display 200 and the embodiment of the display 100 is described in detail in the following.

In the repair method of the display of the embodiment, the display 200 is tested to position the dead sub-pixels DSP (i.e., positioning the dead pixels DP). In the embodiment, the display 200 has two dead pixels DP. A sub-pixel of a first dead pixel DP1 is a first dead sub-pixel DSP1, and the light emitting device 120 in the first dead sub-pixel DSP1 is a dead light emitting device DLD1. A sub-pixel of a second dead pixel DP2 is a second dead sub-pixel DSP2, and the light emitting device 120 in the second dead sub-pixel DSP2 is a dead light emitting device DLD2. Then, a compensated region M2 is defined. Specifically, the compensated region M2 includes the two dead sub-pixels DSP1 and DSP2.

In the embodiment, the light emitting device 120 (i.e., the dead light emitting device DLD1) in the first dead sub-pixel DSP1 has a predetermined emission color, such as red. Also, the predetermined emission color of the dead light emitting device DLD2 in the second dead sub-pixel DSP2 is also red.

Referring to FIG. 2B, in the repair method of the display of the embodiment, a plurality of compensating light emitting devices 230 are provided, and the compensating light emitting devices are bonded to the compensated regions in the compensated region M2 on the back plate to obtain a repaired display 200'.

Specifically, a process of providing the compensating light emitting devices 230 includes providing a transfer substrate (not shown). The compensating light emitting devices 230 are disposed on the transfer substrate and the predetermined emission color of the compensating light emitting devices 230 is the same as the predetermined emission color of the dead light emitting devices DLD1 and DLD2. Then, the transfer substrate is docked to the back plate 110 to transfer the compensating light emitting devices 230 to the back plate 110 and to dispose the compensating light emitting devices 230 in the compensated region M2 on the back plate 110. Specifically, the process of disposing the light emitting devices 230 on the back plate 110 further includes forming a bonding layer 140 in each of the reserved compensated region RR. When the transfer substrate (not shown) is docked to the back plate 110, each of the light emitting devices 130 is bonded to the reserved compensated region RR through the bonding layer 140. However, in other embodiments, the compensating light emitting devices 230 may also be disposed on the back plate 110 in a different way. The invention does not intend to impose a limitation in this regard. Therefore, the compensating light emitting devices 230 located at the dead pixels DP1 and DP2 may substitute for the original light emitting devices 120 to emit light, the repaired display 200' may have a better display quality.

In the embodiment, the compensating light emitting devices 230 in the compensated region M2 are form a matrix array and disposed in the first dead pixel DP1, in the second dead pixel DP2, and in other good pixels P on the back plate 110. Specifically, each the pixels P in the compensated region M2 has the compensating light emitting devices to repair when necessary. In general, the compensated region M2 is in a size of a predetermined number of pixels. After the dead pixels of the display panel are detected, a number of the compensated region M2 and the corresponding position of the compensated region M2 may be calculated and arranged to reduce repair times. In other words, this embodiment describes one compensated region as an example, but there may be a plurality of the compensated regions on a whole panel to repair the dead pixels as many as possible. The repair method of the display of the embodiment is able to repair the dead pixels DP in one repair process without repairing the dead pixels one by one. Namely, the repair method of the display of the embodiment may repair the display 200 at a high efficiency. Therefore, the repaired display 200' has a better display quality.

Figure 3:
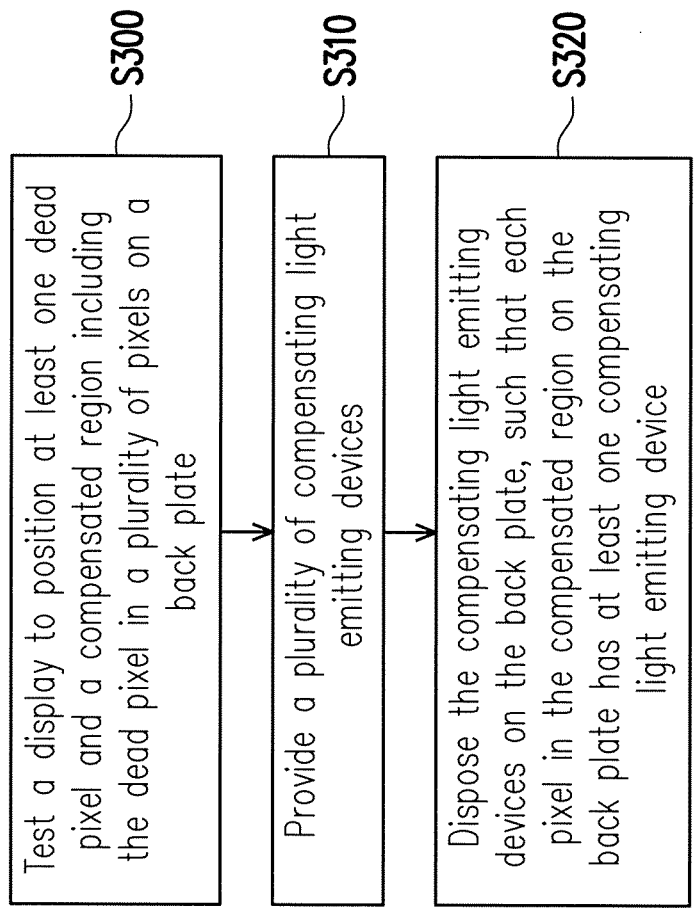
FIG. 3 is a flowchart illustrating a repair method of a display according to an embodiment of the invention.

FIG. 3 is a flowchart illustrating a repair method of a display according to an embodiment of the invention. The repair processes of the embodiment are applicable in repairing the display 100 and the display 200 in FIGS. 1A to 2B. Specifically, the repair method of the display is as follows. At Step S300, a display is detected to position at least one dead pixel and a compensated region including the dead pixel on a back plate. Then, at Step S310, a plurality of compensating light emitting devices are provided. Subsequently, at Step S320, the compensating light emitting devices are disposed to the back plate. Accordingly, each pixel in the compensated region on the back plate has at least one compensating light emitting device. Specifically, the enough sufficient teaching, suggestions, and illustration for the repair method of the display according to the embodiment of the invention may be obtained from the descriptions about the embodiments of FIGS. 1A to 2B. Thus, details in this regard will not be repeated in the following.

In view of the foregoing, the repair method of the display according to the embodiments of the invention includes detecting the display to position at least one dead pixel and the compensated region including the dead pixel on the back plate including a plurality of pixels, and disposing the compensating light emitting devices in the compensated region on the back plate. Each pixel in the compensated region has the compensating light emitting device. Accordingly, the compensating light emitting device in the dead pixel may substitute for the original light emitting device. Generally speaking, the light emitting device in the dead pixel and the light emitting devices in the pixels near the dead pixel undergo the same epitaxial process or are transferred together. Therefore, the pixels P nearby the dead pixel DP are more likely to be dead pixels, or the light emitting devices of the pixels near the dead pixel have low reliability. In the repair method of the display, each pixel adjacent to the dead pixel is disposed at least one of the compensating light emitting devices, the dead pixels in a compensated region may be repaired at the same time. In other words, we do not need to repair the dead pixels step by step. Namely, the repair method of the display repairs the display at a high efficiency and improves display quality of the repaired display.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display, comprising:
   a back plate, having a plurality of pixels and at least one compensated region, wherein the compensated region comprises at least a part of the plurality of pixels and each of the plurality of pixels comprises a plurality of sub-pixels, each of the plurality of sub-pixels comprises a predetermined light emitting region and a reserved compensated region;
   a plurality of light emitting devices, arranged in the plurality of pixels on the back plate and disposed in the predetermined light emitting regions; and
   a plurality of compensating light emitting devices, disposed on the back plate and located in each pixel in the compensated region, wherein at least one of the plurality of pixels located in the compensated region is a dead pixel and the reserved compensated region is configured to dispose one of the plurality of compensating light emitting devices.

2. The display as claimed in claim 1, wherein each of the plurality of sub-pixels comprises one of the plurality of light emitting devices, one of the plurality of sub-pixels of the dead pixel is a dead sub-pixel, the dead sub-pixel has a predetermined emission color, wherein the plurality of compensating light emitting devices have the predetermined emission color and are disposed in the plurality of sub-pixels having the predetermined emission color in the compensated region.

3. The display as claimed in claim 1, wherein one of the plurality of sub-pixels of the dead pixel is a dead sub-pixel, the dead sub-pixel has a predetermined emission color, wherein the plurality of compensating light emitting devices are disposed in the plurality of sub-pixels having the predetermined emission color in the compensated region and disposed in the reserved compensated regions, each of the reserved compensated regions comprises a bonding layer, and each of the plurality of compensating light emitting devices is bonded to one of the reserved compensated regions through one of the bonding layers.

4. The display as claimed in claim 3, wherein a light emitting device of a predetermined light emitting region of the dead sub-pixel has a poor light emitting performance, or losses during a manufacturing process.

5. The display as claimed in claim 4, wherein the light emitting device having the poor light emitting performance is not electrically connected with the back plate, or is contaminated.

6. The display as claimed in claim 1, wherein the compensated region comprises a plurality of dead pixels.

7. The display as claimed in claim 1, wherein the back plate comprises a plurality of compensated regions.

8. The display as claimed in claim 1, wherein a diagonal length of each of the plurality of light emitting devices and the plurality of compensating light emitting devices is in a range from 2 micrometers to 150 micrometers.

* * * * *